(12) United States Patent
Lin et al.

(10) Patent No.: US 9,721,868 B2
(45) Date of Patent: Aug. 1, 2017

(54) THREE DIMENSIONAL INTEGRATED CIRCUIT (3DIC) HAVING A THERMALLY ENHANCED HEAT SPREADER EMBEDDED IN A SUBSTRATE

(71) Applicant: TAIWAN SEMICONDUCTOR MANUFACTURING COMPANY, LTD., Hsinchu (TW)

(72) Inventors: Po-Yao Lin, Zhudong Township (TW); Wen-Yi Lin, New Taipei (TW); Shyue Ter Leu, Hsinchu (TW); Ming-Chih Yew, Hsinchu (TW); Shu-Shen Yeh, Tainan (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/636,866

(22) Filed: Mar. 3, 2015

(65) Prior Publication Data

US 2015/0179617 A1 Jun. 25, 2015

Related U.S. Application Data

(63) Continuation-in-part of application No. 12/782,814, filed on May 19, 2010, now Pat. No. 8,970,029.
(Continued)

(51) Int. Cl.
*H01L 23/427* (2006.01)
*H01L 25/065* (2006.01)
(Continued)

(52) U.S. Cl.
CPC ............ *H01L 23/427* (2013.01); *H01L 23/04* (2013.01); *H01L 23/42* (2013.01); *H01L 23/473* (2013.01);
(Continued)

(58) Field of Classification Search
CPC ... H01L 25/0657; H01L 23/42; H01L 23/427; H01L 23/373; H01L 23/5226; H01L 2023/4043; H01L 2023/4068
See application file for complete search history.

(56) References Cited

U.S. PATENT DOCUMENTS

| 4,914,551 A | 4/1990 | Anschel et al. |
| 5,949,137 A | 9/1999 | Domadia et al. |

(Continued)

FOREIGN PATENT DOCUMENTS

| CN | 100517666 | 7/2009 |
| TW | 200633171 | 9/2006 |
| TW | 200724017 | 6/2007 |

OTHER PUBLICATIONS

Office Action dated Apr. 29, 2013 from corresponding application No. TW 099125308.

*Primary Examiner* — Michael Jung
(74) *Attorney, Agent, or Firm* — Hauptman Ham, LLP

(57) ABSTRACT

A three dimensional integrated circuit (3DIC) includes a first substrate and a heat spreading structure embedded in the first substrate. The 3DIC further includes a die electrically connected to the first substrate, wherein the die is thermally connected to the heat spreading structure. The 3DIC further includes a plurality of memory units on the die, wherein the die is between the plurality of memory units and the first substrate, and the plurality of memory units is thermally connected to the heat spreading structure by the die. The 3DIC further includes an external cooling unit on the plurality of memory units, wherein the plurality of memory units is between the die and the external cooling unit, and the die is thermally connected to the external cooling unit by the plurality of memory units.

20 Claims, 14 Drawing Sheets

Related U.S. Application Data

(60) Provisional application No. 61/229,958, filed on Jul. 30, 2009.

(51) Int. Cl.
*H01L 23/522* (2006.01)
*H01L 29/16* (2006.01)
*H01L 23/42* (2006.01)
*H01L 23/04* (2006.01)
*H01L 23/473* (2006.01)
*H01L 23/40* (2006.01)
*H01L 23/00* (2006.01)

(52) U.S. Cl.
CPC ...... *H01L 23/5226* (2013.01); *H01L 25/0652* (2013.01); *H01L 25/0657* (2013.01); *H01L 29/1606* (2013.01); *H01L 23/562* (2013.01); *H01L 24/16* (2013.01); *H01L 2023/4043* (2013.01); *H01L 2023/4068* (2013.01); *H01L 2224/0401* (2013.01); *H01L 2224/131* (2013.01); *H01L 2224/13147* (2013.01); *H01L 2224/16146* (2013.01); *H01L 2224/16227* (2013.01); *H01L 2224/291* (2013.01); *H01L 2224/2929* (2013.01); *H01L 2224/29109* (2013.01); *H01L 2224/29339* (2013.01); *H01L 2224/32145* (2013.01); *H01L 2224/32225* (2013.01); *H01L 2224/73204* (2013.01); *H01L 2224/73253* (2013.01); *H01L 2224/81815* (2013.01); *H01L 2225/06513* (2013.01); *H01L 2225/06517* (2013.01); *H01L 2225/06541* (2013.01); *H01L 2225/06589* (2013.01); *H01L 2924/01019* (2013.01); *H01L 2924/12042* (2013.01); *H01L 2924/16152* (2013.01)

(56) References Cited

U.S. PATENT DOCUMENTS

| | | | |
|---|---|---|---|
| 6,008,536 A | 12/1999 | Mertol | |
| 6,188,578 B1 | 2/2001 | Lin et al. | |
| 6,212,074 B1 | 4/2001 | Gonsalves et al. | |
| 6,437,437 B1 | 8/2002 | Zuo et al. | |
| 6,525,420 B2 | 2/2003 | Zuo et al. | |
| 6,665,187 B1 | 12/2003 | Alcoe et al. | |
| 6,849,942 B2 | 2/2005 | Lin et al. | |
| 7,002,246 B2 | 2/2006 | Ho et al. | |
| 7,075,161 B2 * | 7/2006 | Barth | G01N 33/48721 257/414 |
| 7,193,851 B2 | 3/2007 | Yatskov | |
| 7,301,227 B1 | 11/2007 | Gektin et al. | |
| 8,324,699 B2 * | 12/2012 | Ichijo | C23C 16/02 257/228 |
| 2002/0056908 A1 | 5/2002 | Brownell et al. | |
| 2005/0001311 A1 | 1/2005 | Ho et al. | |
| 2005/0201060 A1 | 9/2005 | Huang | |
| 2006/0060952 A1 | 3/2006 | Yuan et al. | |
| 2006/0261469 A1 | 11/2006 | Ni et al. | |
| 2007/0035937 A1 | 2/2007 | Colbert et al. | |
| 2007/0267179 A1 | 11/2007 | Hou et al. | |
| 2007/0269288 A1 | 11/2007 | Palm | |
| 2008/0237843 A1 | 10/2008 | Gupta et al. | |
| 2009/0057928 A1 | 3/2009 | Zhai et al. | |
| 2009/0194864 A1 * | 8/2009 | Dang | H01L 23/3736 257/691 |
| 2013/0016477 A1 * | 1/2013 | Yokoya | H01L 23/36 361/719 |
| 2013/0277821 A1 * | 10/2013 | Lundberg | H01L 23/34 257/713 |
| 2014/0179032 A1 * | 6/2014 | Hasebe | H01L 22/14 438/15 |
| 2014/0306250 A1 * | 10/2014 | Gardner | H01L 25/0753 257/89 |
| 2015/0155218 A1 * | 6/2015 | Hung | H01L 23/36 257/690 |
| 2015/0194364 A1 * | 7/2015 | Lamorey | H01L 23/5226 257/698 |
| 2016/0095198 A1 * | 3/2016 | Min | H05K 1/0203 361/705 |
| 2016/0095201 A1 * | 3/2016 | Min | H05K 1/0204 361/709 |
| 2016/0095203 A1 * | 3/2016 | Min | H05K 1/0207 361/690 |

* cited by examiner

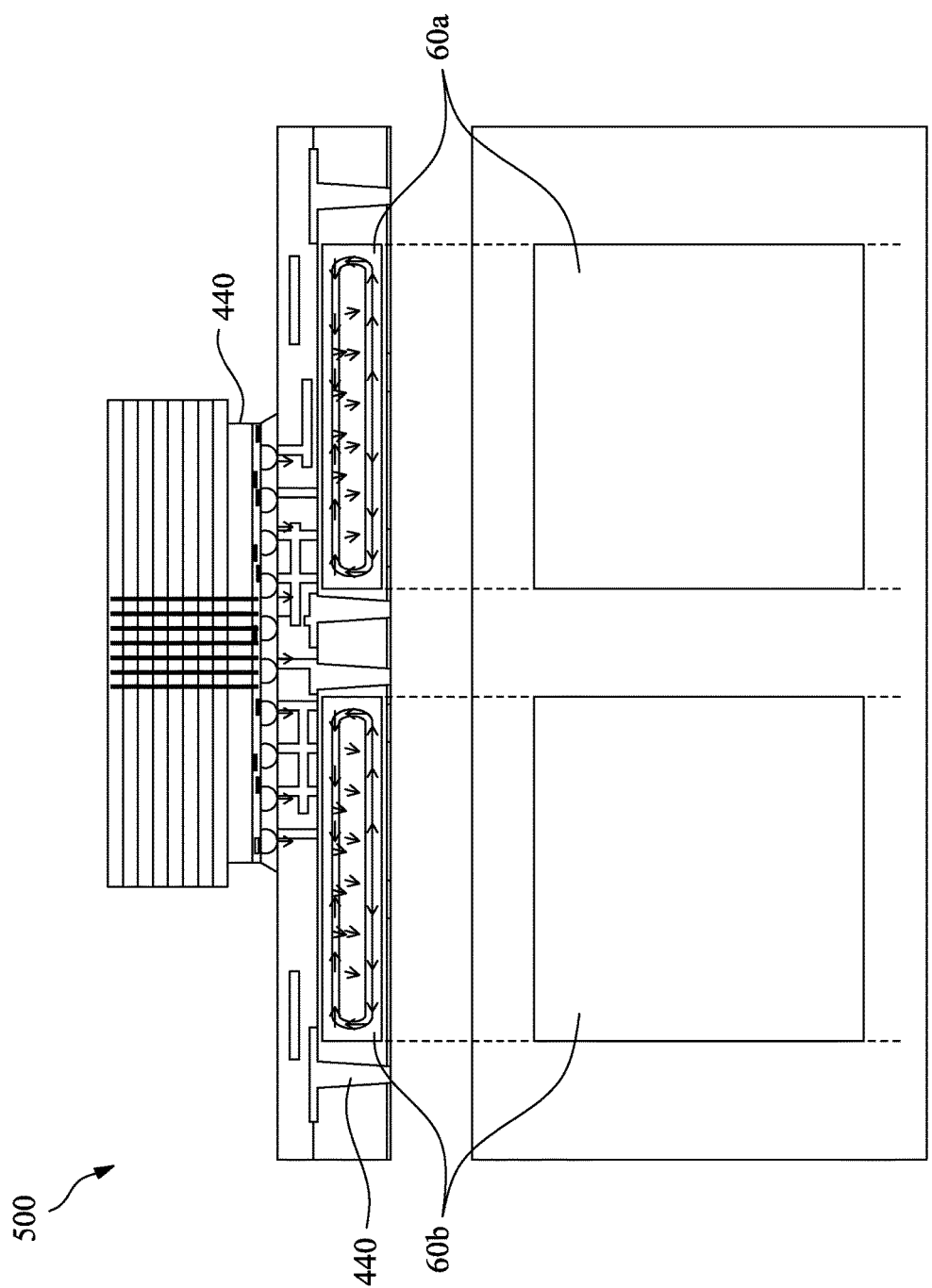

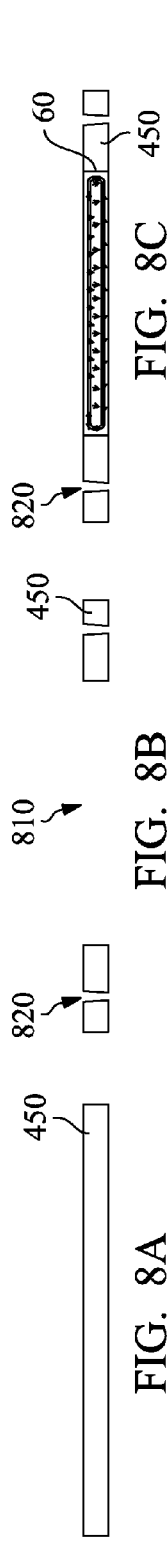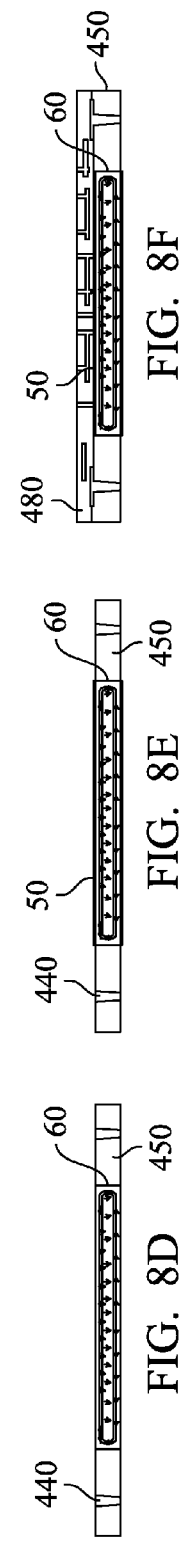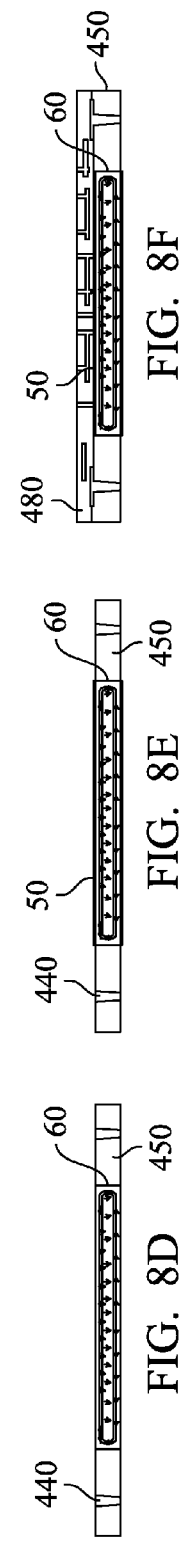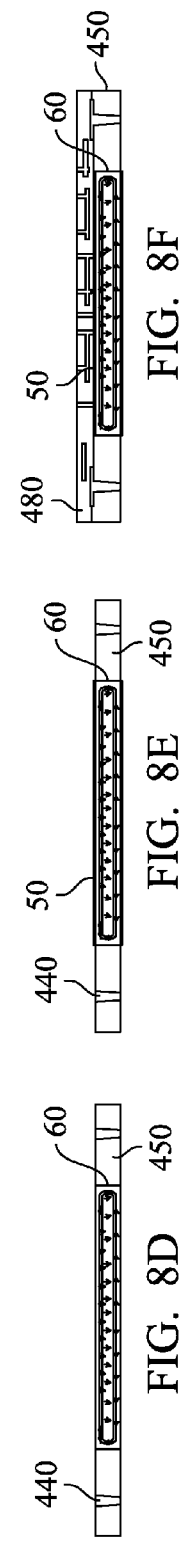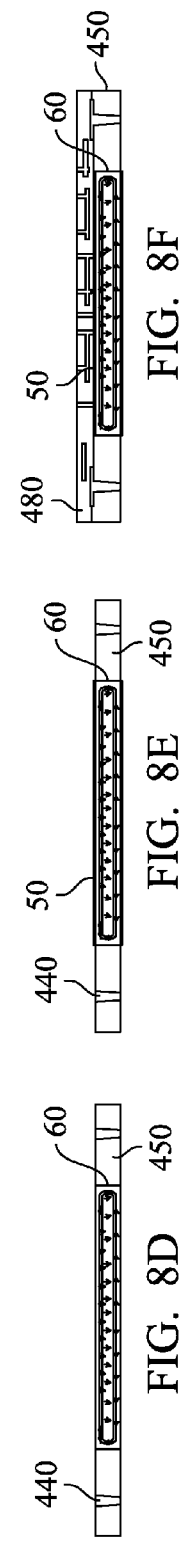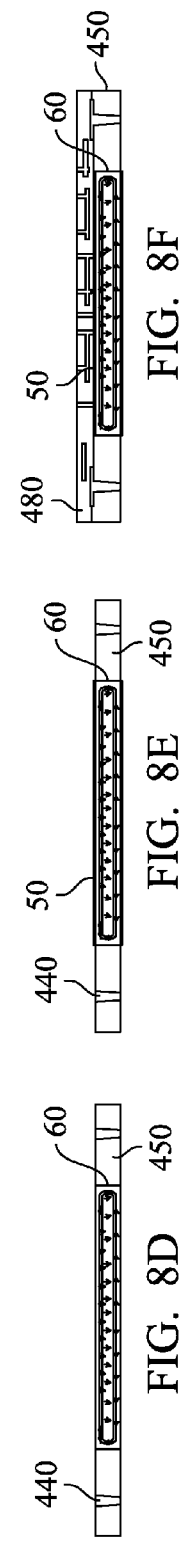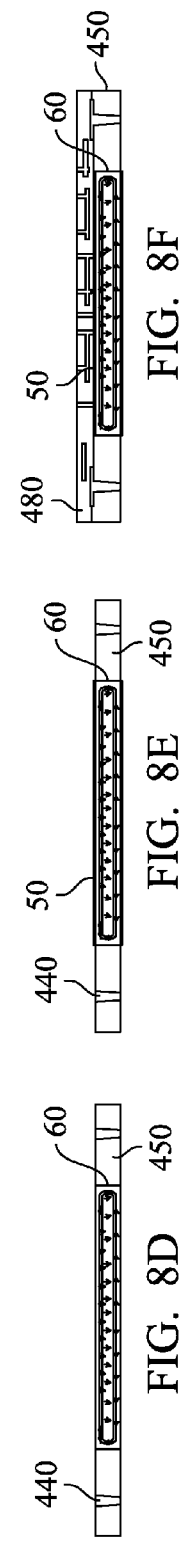

US 9,721,868 B2

THREE DIMENSIONAL INTEGRATED CIRCUIT (3DIC) HAVING A THERMALLY ENHANCED HEAT SPREADER EMBEDDED IN A SUBSTRATE

PRIORITY CLAIM

The present application is a continuation-in-part of U.S. application Ser. No. 12/782,814, filed May 19, 2010, which claims priority of U.S. Provisional Application No. 61/229,958, filed on Jul. 30, 2009, which are incorporated herein by reference in their entireties.

TECHNICAL FIELD

The present disclosure relates generally to a heat spreader, and more particularly, to a thermally enhanced heat spreader embedded in a substrate for flip chip and 3DIC packaging.

BACKGROUND

As packaging density of microelectronic devices increases with technology developments, manufacturers are continually shrinking the sizes of microelectronic devices to satisfy increasing demand for smaller electronic devices, such as a three dimensional integrated circuit (3DIC) package, or package-on-package (PoP). Another trend in modern microelectronic devices is the increasing use of higher power consumption circuits, such as in a modern CPU chip or application processor. In order to accommodate the more densely packaged and the higher power consumption microelectronic devices, the heat dissipation property of a 3DIC package using through substrate vias (TSVs) or PoP technology needs be improved.

A heat sink, sometimes called a heat spreader, normally made of a higher thermal conductivity material such as copper has been used to fulfill the need for improving heat dissipation in 3DIC packages. In some instances, the 3DIC package includes at least one memory chip on a logic chip. Although copper, with its high thermal conductivity is a common solution for a lid of the heat spreader on an external surface of a 3DIC package, there exists a thermal constriction issue for dissipating heat between the memory chip and the logic chip.

The increased use of more densely packaged microelectronic devices, such as memory chips on logic chips, that lead to localized areas between chips or on the chip having relatively high heat generation (e.g., "hot spots") to result in electrical performance degradation or even device failure.

BRIEF DESCRIPTION OF DRAWINGS

The features, aspects, and advantages of the disclosure will become more fully apparent from the following detailed description, appended claims, and accompanying drawings in which:

FIG. 5A is a cross-section view and a top view of a 3DIC including heat spreaders according to some embodiments.

FIGS. 8A-8J are cross sectional view of a 3DIC including a heat spreader at various stages of production according to some embodiments.

DETAILED DESCRIPTION

In the following description, numerous specific details are set forth to provide a thorough understanding of embodiments. However, one having an ordinary skill in the art will recognize that embodiments can be practiced without these specific details. In some instances, well-known structures and processes have not been described in detail to avoid unnecessarily obscuring embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
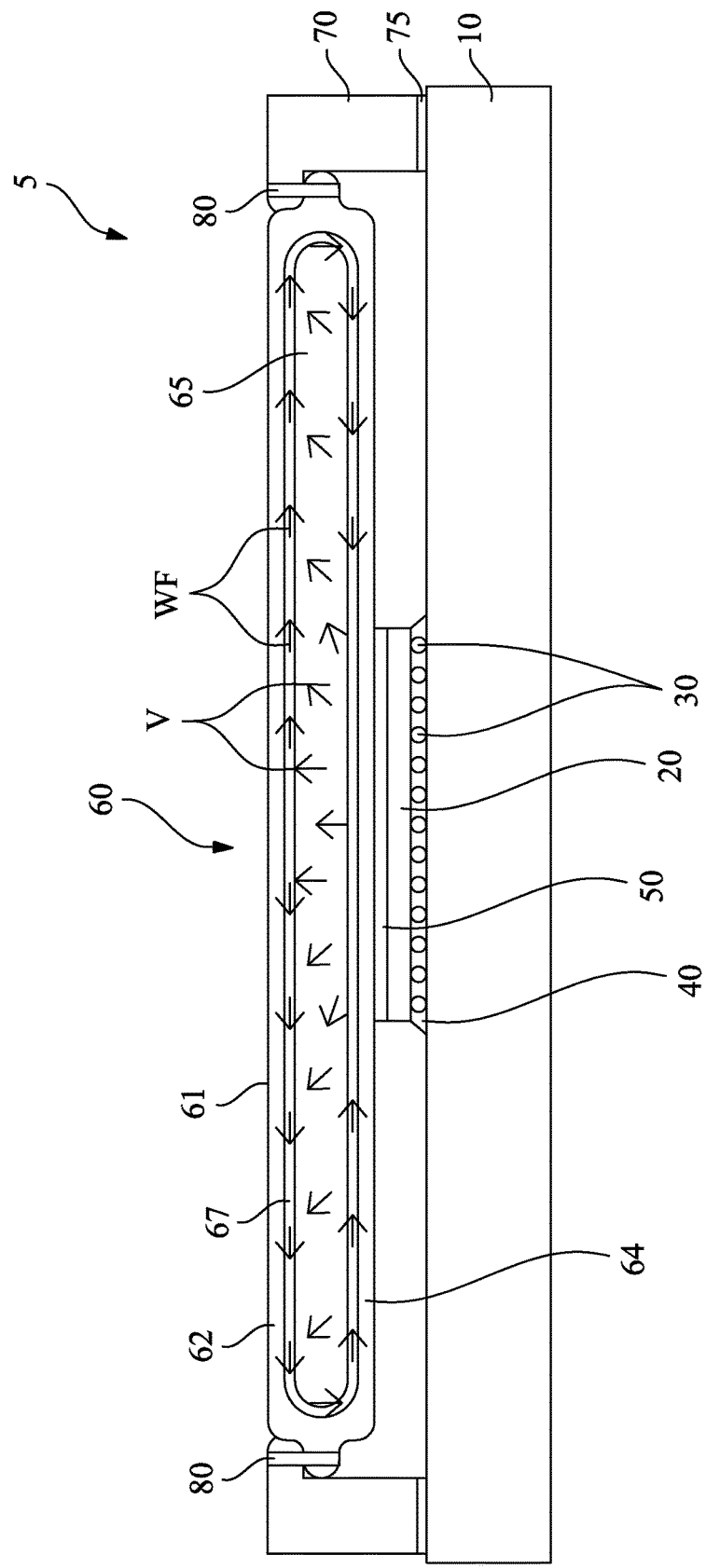
FIG. 1 is a cross-sectional view of a microelectronic package having a heat spreader according to at least one embodiment.

FIG. 1 is a cross-sectional view of a microelectronic package 5 having a heat spreader according to at least one embodiment. The microelectronic package 5 may include a die 20 having a first surface containing a plurality of electrical contacts in electrical communication with active circuitry for an intended application, and a second surface generally opposed to the first surface. The first surface of the die 20 may be mounted in electrical coupling with a carrier substrate 10 using joining members, such as copper pillars or solder bumps 30, by flip chip mounting the first surface of the die 20 with the substrate 10. Suitable materials for the substrate 10 include, but are not limited to, epoxy resin bonded glass fabric and an organic substrate (e.g., comprising a core layer of glass epoxy or glass-polyimide-based copper trace and resin). An underfill material 40, such as epoxy resin, may be filled and sealed in the gap between the die 20 and the substrate 10 thereby encapsulating the solder bumps 30. The underfill material 40 provides mechanical support, electrical isolation of the joining members (e.g., solder bumps), and protection of the active circuitry from the environment. Although not shown, the substrate 10 may also electrically couple the die 20 to an external circuit or printed circuit board by solder balls, or through sockets, or by other interconnect schemes.

The microelectronic package 5 may also comprise a thermal interface material (TIM) 50 that is disposed in thermal conductive contact with the second surface of the die 20. A heat spreader 60 may be disposed in thermal conductive contact with the thermal interface material 50. Providing a thermal interface material 50 as an interface between the die 20 and the heat spreader 60 is advantageous in various aspects, including but not limited to, improved thermal conductivity of the finished microelectronic package 5 and reduced risk of die damage. Because surfaces of the die 20 and the heat spreader 60 are uneven, juxtaposing the heat spreader 60 directly to the die 20 would result in increased thermal resistance of the composite assembly. Interposing a suitable thermal interface material 50 therebetween evens out contact surfaces of the heat spreader 60 and the die 20 to improve thermal conductivity. Also, die damage may arise due to variations in the thickness of the heat spreader 60 and the die 20, and in some situations, resulting in excessive pressure on the die 20 by the heat spreader 60. Providing a thermal interface material 50 between the heat spreader 60 and the die 20 therefore alleviates pressure exerted by the heat spreader 60 on the die 20. Suitable thermal interface material 50 should have high thermal conductivity and should improve thermal contact when disposed between the heat spreader 60 and the die 20. Examples of suitable thermal interface material 50 include, but are not limited to, thermal greases, such as silver filled epoxy or the like, polymer-solder hybrid thermal interface material, and indium foil. The thickness of the thermal interface material 50 will vary depending upon the performance requirements of the die 20. In one embodiment, the thickness of the thermal interface material 50 varies from about 50 microns to about 100 microns.

Referring still to FIG. 1, the heat spreader 60 is disposed in thermal conductive contact with the thermal interface material 50. The heat spreader 60 includes a lid 61 having an inner vapor chamber 65 therein defined by an outer or top wall 62 and an inner or bottom wall 64, the bottom wall 64 attached to the top wall 62, along their common edges, to hermetically seal the chamber 65 at their joining interface. The vapor chamber 65 extends transversely and longitudinally throughout the lid 61, according to aspects. In FIG. 1, the longitudinal direction is the horizontal direction and the transverse direction is into a plane of the Figure. In one embodiment, the top wall 62 and the bottom wall 64 comprise substantially uniform thickness sheets of a thermally conductive material, and are spaced apart by about 0.5 mm to about 1 mm so as to form the void space or the vapor chamber 65 between them. In some embodiments, the depth and/or width of the vapor chamber 65 may vary, e.g., either narrowing or broadening in a particular direction.

A two-phase vaporizable liquid resides within the chamber 65, and serves as the working fluid, WF for the heat spreader 60. The working fluid, WF may comprise freon, water, alcohol or a like liquid being capable of vaporizing and possessing a relatively high latent heat in order to disperse heat away from the die 20.

The lid 61 has a low coefficient of thermal expansion substantially similar to the low coefficient of thermal expansion of the carrier substrate 10. According to one embodiment, the lid 61, including the top wall 62 and the bottom wall 64 is made of a material having a low coefficient of thermal expansion (CTE), such as copper, copper alloy, copper tungsten (CuW), or aluminum-silicon-carbide (AlSiC). Other suitable materials may also be used for the lid 61 so long as the material possesses at least a low coefficient of thermal expansion and high thermal conductivity. The thickness of the lid 61 depends on several factors including, but not limited to, heat dissipation rate of the die 20, thermal conductivity of the heat spreader material, presence of an external heat sink, required size of the finished microelectronic package 5, and surface area of the die 20.

The lid 61 is mounted to the substrate 10 by attachment frame 70, which serves to support lid 61 above substrate 10 and die 20. The height of the attachment frame 70 is selected such that a gap that exists between a surface of the lid 61 and substrate 10. A top surface of the substrate 10 is sized to accept at least the die 20. To prevent delamination of the heat spreader 60 from the substrate 10, the attachment frame 70 has a low coefficient of thermal expansion substantially similar to the low coefficient of thermal expansion of the carrier substrate 10. According to one embodiment, the attachment frame 70 comprises a material having a low coefficient of thermal expansion (CTE) such as for example, copper, copper alloy, copper tungsten (CuW), or aluminum-silicon-carbide (AlSiC). Other suitable materials may also be used for the attachment frame 70 so long as the material possesses at least a low coefficient of thermal expansion. The attachment frame 70 may be constructed in various ways, including, but not limited to the illustration shown in FIG. 1 and may be constructed in various forms or shapes, again not limited to what is depicted in FIG. 1.

The lid 61 is securely fastened to the attachment frame 70 by means of one or more securing devices 80. The securing devices 80 may include rivets, screws, solder, adhesives, or other means for securing the lid 61 to the attachment frame 70. The attachment frame 70 is mounted to the substrate by an adhesive 75.

Figure 2:
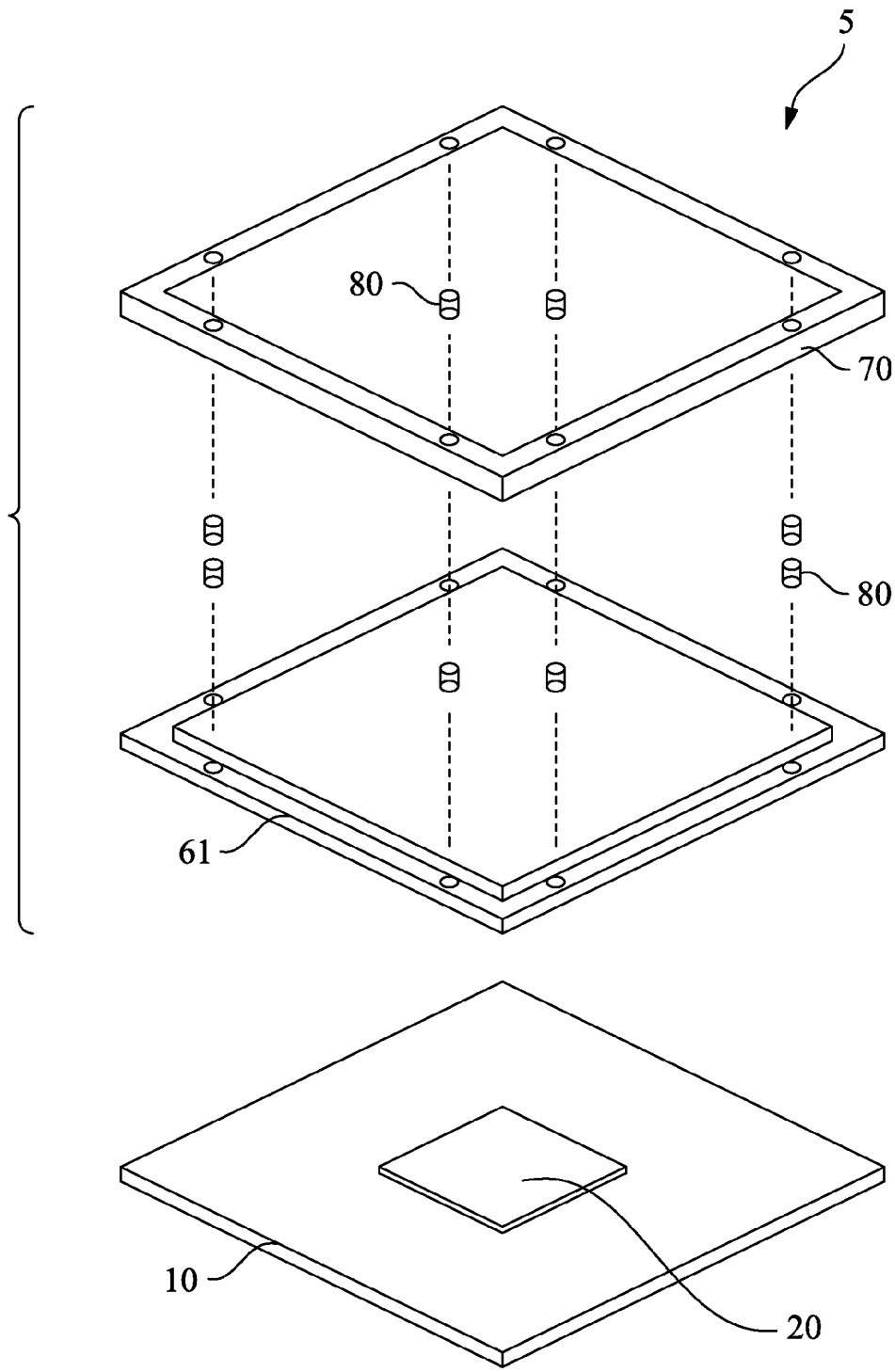
FIG. 2 is an expanded view of FIG. 1.

An expanded view of the microelectronic package 5 including heat spreader 60 is depicted in FIG. 2 in accordance with some embodiments.

Figure 3:
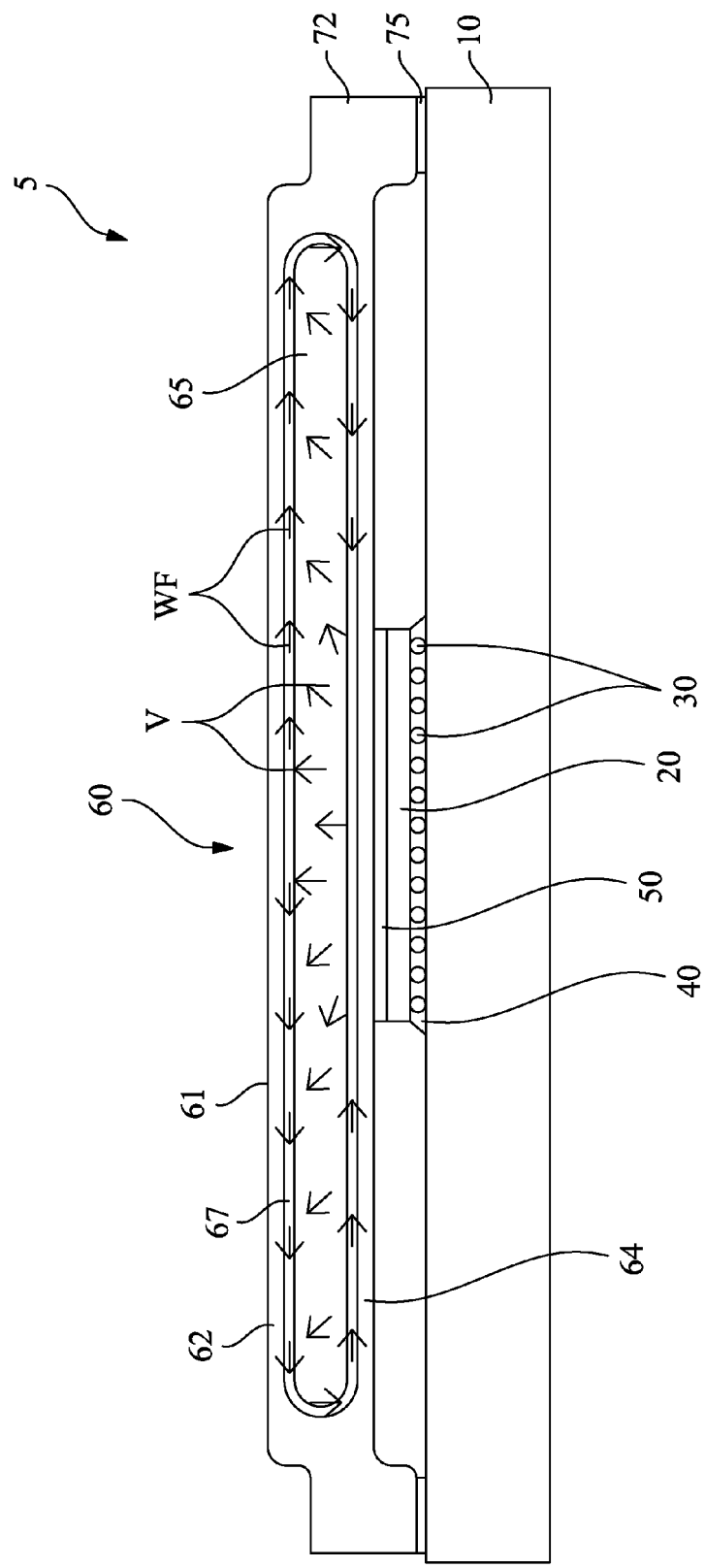
FIG. 3 is a cross-sectional view of a microelectronic package having a heat spreader according to at least one embodiment.

FIG. 3 is a cross-sectional view of a microelectronic package 5 having a heat spreader 60, according to another embodiment. Instead of having the attachment frame 70 fasten the lid 61 to the substrate 10, the lid 61 itself serves as the fastening mechanism, as well as the support for the lid 61 above substrate 10 and die 20. The lid 61 includes mounting flanges 72 that are formed along the peripheral edges or on all sides of the lid 61 for securing the lid 61 to the substrate. The mounting flanges 72 may be constructed in other forms or shapes, apart from what is illustrated in FIG. 3.

To prevent delamination of the heat spreader 60 from the substrate 10, the mounting flanges 72 have a low coefficient of thermal expansion substantially similar to the low coefficient of thermal expansion of the carrier substrate 10. According to one embodiment, the mounting flanges 72 comprise a material having a low coefficient of thermal expansion (CTE) such as for example, copper, copper alloy, copper tungsten (CuW), aluminum-silicon-carbide (AlSiC), copper-silicon-carbide (CuSiC). Other suitable materials may also be used for the mounting flanges 72 so long as the material possesses at least a low coefficient of thermal expansion. The mounting flanges are secured to the substrate 10 by an adhesive 75.

As shown in FIGS. 1 and 2, a substantially planar wick layer 67 is positioned in the chamber 65, the wick layer 67 for receiving the working fluid, WF. According to one embodiment, the wick layer 67 is positioned substantially along the inner or inside walls of the chamber 65. In some embodiments, the wick layer 67 is positioned substantially along the inner surfaces of the top wall 62 and the bottom wall 64 of the lid 61. The wick layer 67 is made by weaving metal wires that have a large amount of pores (not shown)

therein, to generate capillary force for transferring the working fluid, WF. Alternatively, the wick layer 67 can also be made by other methods (e.g., sintering metal power). The wick layer may have an average thickness of about 0.1 mm to about 0.5 mm in some embodiments.

In operation, as the die 20 (or other electronic component) maintained in thermal contact with the heat spreader operates and generates heat, the working fluid, WF contained in the wick layer 67 corresponding to a hot contacting location is heated and vaporizes. The vapor, V then spreads to fill the vapor chamber 65, and wherever the vapor, V comes into contact with a cooler surface of the chamber 65, it releases its latent heat of vaporization and condenses to liquid. The condensate reflows to the hot contacting location via a capillary force generated by the wick layer 67. Thereafter, the condensate frequently vaporizes and condenses to form a circulation to thereby remove the heat generated by the die 20, or other electronic components. This structure effectively spreads thermal energy across the heat spreader 60 so that it may be drawn off and dissipated, e.g., by conventional finned heat sinks or heat pipes, attached to the top wall 62 of the lid 61.

Aspects of the heat spreader 60 thus provides the flip chip microelectronic package 5 with enhanced ability to spread the heat generated by die 20 (or other electronic components) at hot spots on the device to a much larger surface area. It is understood that the heat spreader 60 may vary considerably from one design to another. It is also to be understood that the lid 61 of the heat spreader is not limited to any one lid configuration shown in the drawings.

Figure 4A:
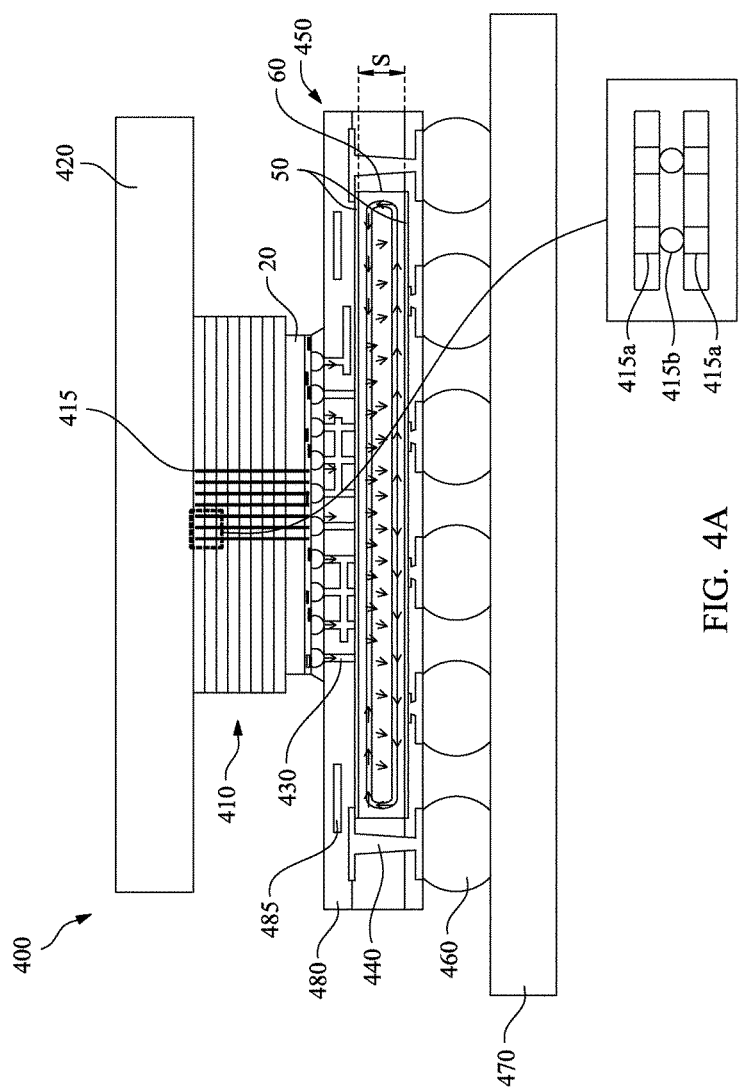
FIG. 4A is a cross-section view of a three-dimensional integrated circuit (3DIC) including a heat spreader according to some embodiments.

FIG. 4A is a cross-section view of a three-dimensional integrated circuit (3DIC) 400 including a heat spreader 60 according to some embodiments. 3DIC 400 includes elements which are similar to package 5 (FIG. 1). Elements which are the same have a same reference number. 3DIC 400 includes a stack of memory units 410 electrically connected by conductive paths 415. An external cooling unit 420 is thermally connected to stack of memory units 410. Stack of memory units 410 is electrically and thermally connected to die 20. Die 20 is connected to heat spreader 60 through TIM 50 by vias 430. In some embodiments, heat spreader 60, TIM 50 and vias 430 are collectively referred to as a heat spreading structure. Through substrate vias (TSVs) 440 extend through a substrate 450 to provide an electrical connection between die 20 or stack of memory units 410 and conductive bumps 460. Heat spreader 60 is connected to conductive bumps 460 through TIM 50. A substrate 470 is connected to substrate 450 by conductive bumps 460. A portion of substrate 450 between die 20 and heat spreader 60 is a routing layer 480. Routing layer 480 includes electrical routing paths to permit signals to propagate from conductive bumps 460 to die 20 or stack of memory units 410. Routing layer 480 includes a plurality of redistribution layers (RDLs) 485 connect conductive bumps 460 to die 20 or stack of memory units 410 to facilitate signal transfer between various devices within 3DIC 400.

Conductive paths 415 provide a path for conductive heat transfer between individual memory units of stack of memory units 410. Heat spreader 60 is configured to absorb the thermal energy through vias 430 and spread the thermal energy across substrate 450 or into conductive bumps 460. In some embodiments, substrate 450 includes an organic material which has a low thermal conductivity coefficient. Small electronic devices, such as mobile communication devices or tablets, are manufactured with organic material substrates. Effective control of thermal energy helps to increase the useful life and precise operation of the small electronic devices. In some embodiments, heat spreader 60 is also configured to transfer thermal energy to substrate 470 through conductive elements 460.

An area of heat spreader 60 is greater than an area of die 20. In some embodiments, the area of heat spreader 60 is greater than about twice the area of die 20. In some embodiments, a ratio of the area of heat spreader 60 to the area of die 20 ranges from about 2 to about 4. If the ratio of the area of heat spreader 60 to the area of die 20 is too small, the heat spreader does not effectively dissipate heat from the die. If the ratio of the area of heat spreader 60 to the area of die 20 is too large, an overall size of 3DIC 400 is increased without a significant increase in heat spreading ability. In some embodiments, a distance S between a top surface of heat spreader 60 and a bottom surface of the heat spreader 60 ranges from about 0.2 mm to about 1.0 mm in order to provide sufficient volume for fluid evaporation to effectively spread heat and avoid needlessly increasing a size of 3DIC 400. In some embodiments, wick layer 67 (FIG. 1) of heat spreader 60 in 3DIC 400 has an average thickness of about 0.1 mm to about 0.25 mm in order to provide sufficient fluid transportation through the heat spreader 60 an avoid needlessly increasing the size of 3DIC 400.

External cooling unit 420 is configured to dissipate thermal energy from stack of memory units 410 on an opposite side from heat spreader 60. In some embodiments, external cooling unit 420 includes fins for radiative heat dissipation to a surrounding environment. In some embodiments, external cooling unit 420 includes at least one thermal conductive plate for transferring thermal energy to the surrounding environment. In some embodiments, external cooling unit 420 includes another suitable heat transferring structure to help reduce thermal energy generated by stack of memory units 410. In comparison with 3DICs which do not include a heat spreader on a side of die 20 opposite from external heating unit 420, 3DIC 400 has an increased ability to disperse heat generated by the die and stack of memory units 410. In some instances, a difference between a temperature of a memory unit of stack of memory unit 410 closest to external cooling unit 420 and a temperature of die 20 is greater than 20-degrees Celsius in a 3DIC which does not include heat spreader 60. In some instances, the temperature difference is between 20-degrees Celsius and 30-degrees Celsius. The high temperature difference causes die 20 to operate at a temperature above a desired operating temperature range, in some instances. In contrast, a different between the temperature of the memory unit of stack of memory units 410 closest to external cooling unit 420 and die 20 in 3DIC 400 is less than about 17-degrees Celsius. In some embodiments, the temperature difference is between about 10-degrees Celsius and about 15-degrees Celsius. The reduced temperature of die 20 in 3DIC 400 in comparison with a 3DIC which does not include heat spreader 60 helps the die 20 and stack of memory units 410 to operate within a desired temperature operating range to increase reliability. For example, in some embodiments, devices within 3DIC 400 are designed to function within a preferred operating temperature range from about 85-degrees Celsius to about 105-degrees Celsius. A temperature difference of greater than 20-degrees Celsius means that at least a portion of the devices within a 3DIC will be operating outside of the preferred operating temperature. As a result the reliability of the 3DIC will be decreased. Heat spreader 60 within 3DIC 400 helps to maximize the number of devices within 3DIC 400 operating within a preferred operating temperature range by reducing a temperature difference at various points within the 3DIC.

An enlarged portion of stack of memory units 410 is included in FIG. 4A. Stack of memory units 410 includes a plurality of individual memory units connected by conductive elements 415b, which are part of conductive paths 415. In some embodiments, the conductive elements 415b include microbumps, copper pillars, or other suitable conductive elements. Vias 415a, which are part of conductive paths 415, extend through individual memory units of stack of memory units 410 and are connected together by the conductive elements 415b between memory units of the stack of memory units. Conductive paths 415 provide a path for electrical signals to be transferred between memory units and die 20 as well as for conductive heat transfer. In some embodiments, stack of memory units 410 includes random access memory (RAM), such as dynamic RAM (DRAM), static RAM (SRAM), flash memory, magneto-resistive memory, or another suitable type of memory. In some embodiments, stack of memory units 410 is replaced with a different type of device, such as a logic circuit device or another device similar to die 20.

External cooling unit 420 is configured to transfer heat generated in stack of memory units 420 and die 20 to the external environment. In some embodiments, an area of external cooling unit 420 is greater than an area of die 20 or stack of memory units 410. In some embodiments where substrate 470 is free of electrical connections on a surface opposite to stack of memory units 410, external cooling unit 420 is on an opposite side of stack of memory units 410 from heat spreader 60 and on an opposite side of substrate 470 from the heat spreader. In some embodiments, external cooling unit 420 opposite stack of memory units 410 from die 20 has a same structure as external cooling unit opposite substrate 470 from the die. In some embodiments, external cooling unit 420 opposite stack of memory units 410 from die 20 has a different structure from external cooling unit opposite substrate 470 from the die.

Vias 430 include thermally conductive material. In some embodiments, vias 430 include copper, tungsten or another suitable thermally conductive material. In some embodiments, vias 430 are configured to propagate electrical signals from die 20 to substrate 450. A density of vias 430 is greater than 3%. The density of vias 430 is defined by a total area of the vias below die 20 divided by a total area of die 20. In some embodiments, the density of vias 430 ranges from about 3% to about 20%. If the density of vias 430 is too low, the vias do not provide sufficient thermal conductive paths to heat spreader 60 for effectively controlling heat in 3DIC 400. If the density of vias 430 is too high, productions cost will increase without a significant increase in heat spreading ability, electrical performance capability or a mechanical strength of 3DIC 400 is reduced, in some embodiments. In some embodiments where vias 430 do not propagate electrical signals, the vias 430 are replaced with a thermally conductive plate.

In some embodiments, vias 430 are formed by patterning substrate 450 to define a plurality of openings. In some embodiments, substrate 450 is patterned by etching, laser drilling or another suitable patterning technique. The plurality of openings is filled with a thermally conductive material. In some embodiments, the openings are filled using PVD, sputtering, CVD or another suitable formation process. Vias 430 are connected to die 20 through conductive elements, such as solder bumps, copper pillars or other suitable conductive elements. In some embodiments, vias 430 are connected to die 20 by a bonding process which involves reflow or another suitable process.

Conductive vias 440 or substrate 450 is configured to provide electrical connections between die 20 and conductive elements 460. In some embodiments, conductive vias 440 are electrically connected to die 20 by vias 430 by RDLs 485 in routing layer 480. In some embodiments, conductive vias 440 are electrically connected to die 20 through RDLs 485 by elements other than vias 430. In some embodiments, conductive vias 440 include copper, aluminum, tungsten, or another suitable electrically conductive material.

Substrate 450 is configured to support heat spreader 60, vias 430 and conductive vias 440. In some embodiments, at least one opening in substrate 450 for receiving heat spreader 60 is formed by etching, laser drilling, or another suitable material removal process. In some embodiments, routing layer 480 over heat spreader 60 is formed by oxide deposition, physical vapor deposition (PVD), chemical vapor deposition (CVD) or another suitable formation process. Routing layer 480 is then patterned using a material removal process, such as etching or laser drilling. Openings within patterned routing layer 480 are then filled with a conductive material to form RDLs 485. Vias 430 are also formed in routing layer 480. In some embodiments, RDLs 485 and/or the vias 430 are formed by a damascene process, such as a dual damascene process. Vias 430 and/or RDLs 485 are then connected to die 20 by a bonding process. In some embodiments, substrate 450 includes an organic material. In some embodiments, substrate 450 includes a semiconductor material, such as silicon, silicon germanium, or another suitable semiconductor material. In some embodiments, substrate 450 is doped. In some embodiments, substrate 450 is undoped or unintentionally doped.

TIM 50 provides a substantially flat surface between heat spreader 60 and substrate 450. The substantially flat surface helps to reduce mechanical stress between heat spreader 60 and substrate 450 by evenly distributing a weight of the heat spreader across substrate 450. TIM 50 also helps with formation of a portion of substrate 450 between heat spreader 60 and die 20 by providing a more uniform surface for forming the portion of substrate 450. Substrate 470 is electrically connected to substrate 450 by conductive elements 460. In some embodiments, substrate 470 includes an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 470 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure. In some embodiments, substrate 470 is a printed circuit board (PCB). In some embodiments, substrate 470 includes at least one functional circuit. In some embodiments, substrate 470 dissipates heat to the surrounding environment using radiative heat transfer.

Conductive elements 460 electrically connect substrate 450 to substrate 470. In some embodiments, conductive elements 460 are solder bumps, such as C4 bumps. In some embodiments, conductive elements 460 are copper pillars or another suitable conductive element.

Figure 4B:
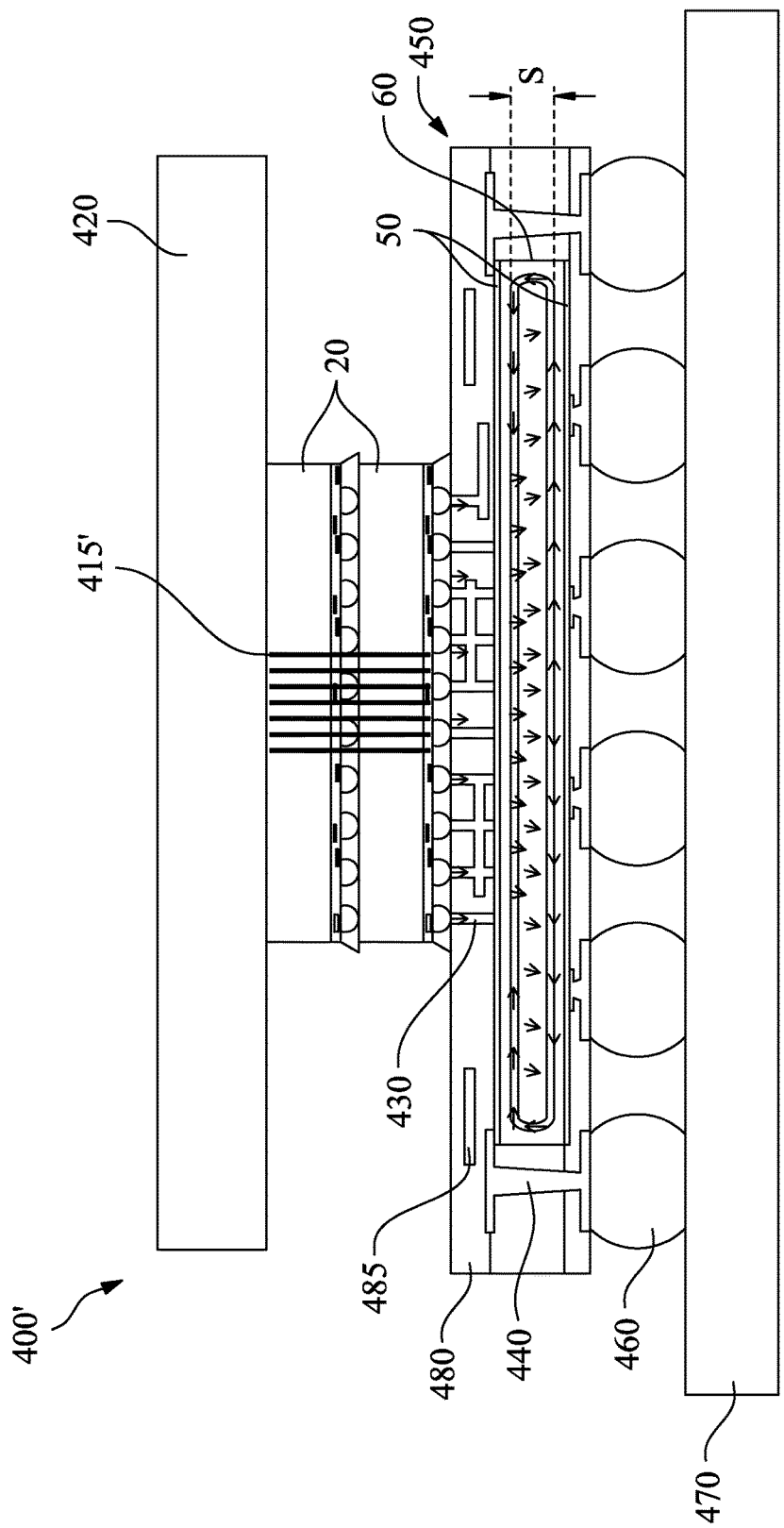
FIG. 4B is a cross-section view of a 3DIC including a heat spreader according to some embodiments.

FIG. 4B is a cross sectional view of a 3DIC 400' and a heat spreader 60 in accordance with some embodiments. In comparison with 3DIC 400, 3DIC 400' includes to dies 20 stacked a top one another and omits stack of memory units 410. Dies 20 are connected to one another by conductive elements such as solder bumps, copper pillars, microbumps or other suitable conductive elements. Conductive paths 415' extend through dies 20 to conduct thermal energy and electrical signals between dies 20.

Figure 4C:
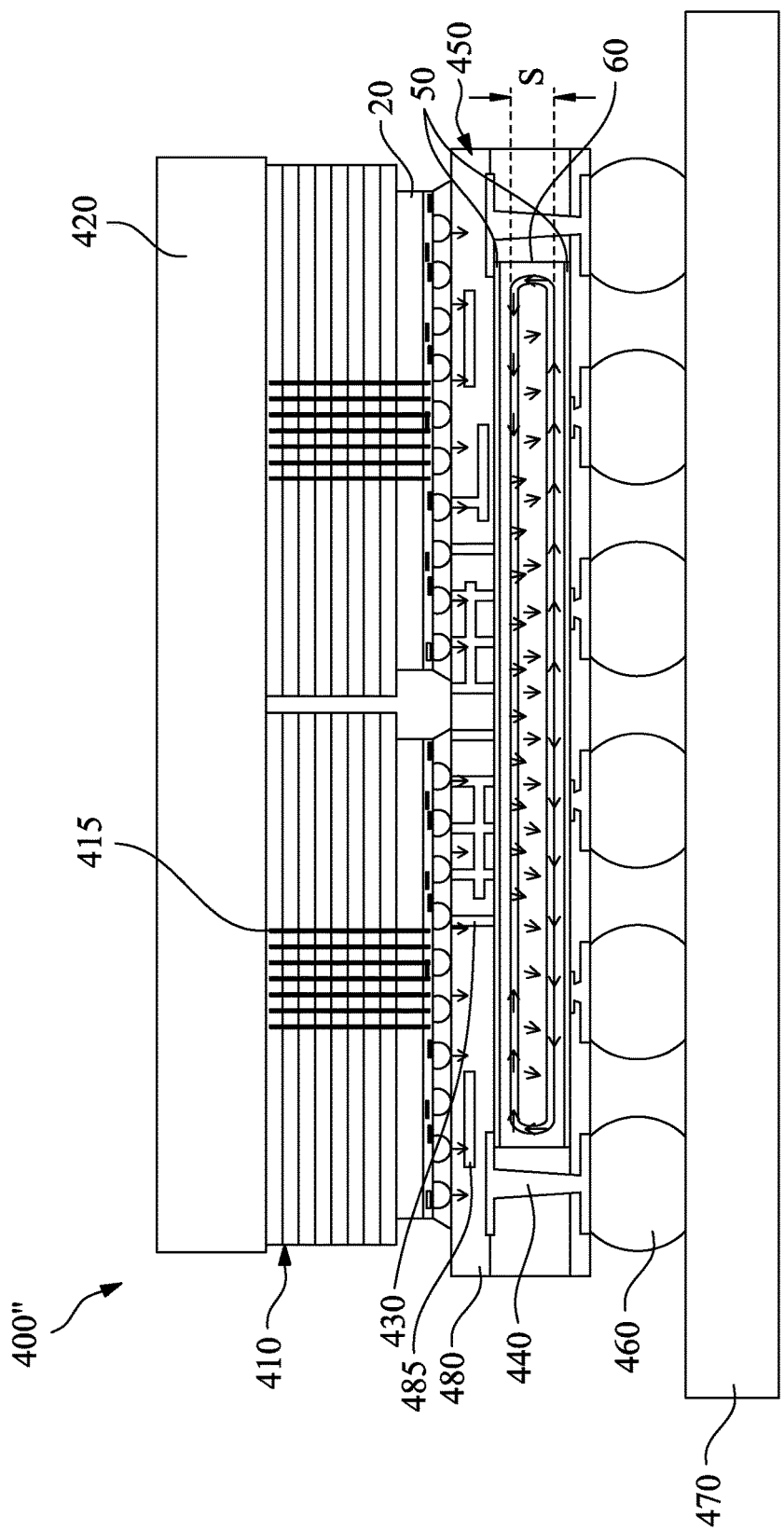
FIG. 4C is a cross-section view of a 3DIC including a heat spreader according to some embodiments.

FIG. 4C is a cross sectional view of a 3DIC 400" and a heat spreader 60 in accordance with some embodiments. In comparison with 3DIC 400, 3DIC 400" includes to plural dies 20 and plural stacks of memory units 410 connected to a same heat spreader 60. An area of heat spreader 60 is greater than a total area of the plural dies 20. In some embodiments, the area of heat spreader 60 is at least twice the total area of the plural dies 20. In some embodiments, a ratio of the area of heat spreader to the total area of the plural dies 20 ranges from about 2 to about 4.

FIG. 5A is a cross sectional view and top view of a 3DIC 500 including a heat spreader 60a and a heat spreader 60b in accordance with some embodiments. 3DIC 500 is similar to 3DIC 400 and same elements have the same reference numbers. In some embodiments, 3DIC 500 includes external cooling unit 420 over stack of memory units 410. In comparison with 3DIC 400 (FIG. 4), 3DIC 500 includes heat spreaders 60a and 60b separated into two sections. In some embodiments, heat spreaders 60a and 60b are collectively referred to as a heater spreading structure. A portion of substrate 450 extends between at least a portion of a first section 60a and a second section 60b. At least one conductive via 440 extends through substrate 450 between first section 60a and second section 60b.

A total area of heat spreader 60a and heat spreader 60b is grater than the area of die 20. In some embodiments, the total area of heat spreader 60a and heat spreader 60b is at least twice the area of die 20. In some embodiments, a ratio of the total area of first section 60a and second section 60b to the area of die 20 ranges from about 2 to about 4.

In some embodiments, first section 60a is completely separated from second section 60b. In some embodiments, at least one connecting area connects first section 60a and second section 60b. The connecting area connects a vapor chamber of first section 60a to a vapor chamber of second section 60b.

By including conductive vias 440 extending between heat spreader 60a and heat spreader 60b, 3DIC 500 includes a less complicated routing scheme in comparison with 3DIC 400. The routing scheme provides electrical connection between die 20 and substrate 470. The openings between heat spreader 60a and heat spreader 60b provide a more direct electrical connection between die 20 and substrate 470, which reduces the complexity of the routing scheme of 3DIC 500. Reducing the complexity of the routing scheme reduces a cost and of designing 3DIC 500 in comparison with 3DIC 400. Reducing the complexity of the routing scheme also reduces an overall size of 3DIC 500 in comparison with 3DIC 400, in some embodiments.

Figure 5B:
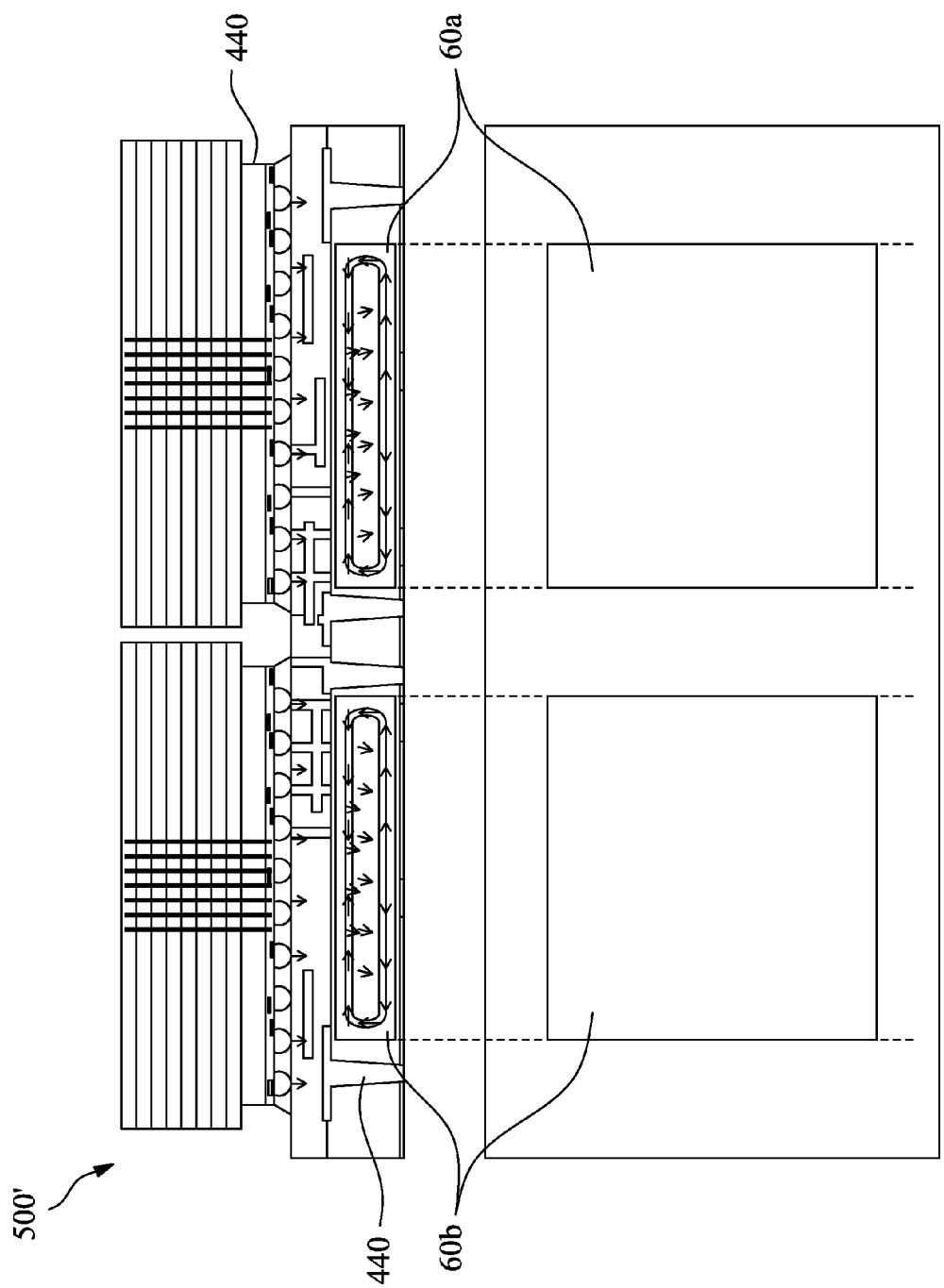
FIG. 5B is a cross-section view and a top view of a 3DIC including heat spreaders according to some embodiments.

FIG. 5B is a cross sectional view and top view of a 3DIC 500' including a heat spreader 60a and a heat spreader 60b in accordance with some embodiments. In comparison with 3DIC 500, 3DIC 500' includes to plural dies 20 and plural stacks of memory units 410 each of which is connected to a separate heat spreader 60a or heat spreader 60b. A total area of heat spreaders 60a and 60b is greater than a total area of the plural dies 20. In some embodiments, the total area of heat spreaders 60a and 60b is at least twice the total area of the plural dies 20. In some embodiments, a ratio of the total area of heat spreaders 60a and 60b to the total area of the plural dies 20 ranges from about 2 to about 4. 3DIC 500' includes a one to one ratio between the number of dies 20 and the number of heat spreaders 60a and 60b. In some embodiments, multiple dies 20 are connected to a same heat spreader 60a or 60b. In some embodiments, multiple heat spreaders 60a and 60b are connected to a single die 20. In some embodiments, heat spreader 60a is connected to multiple dies 20 and heat spreader 60b is connected to a single die 20.

Figure 6A:
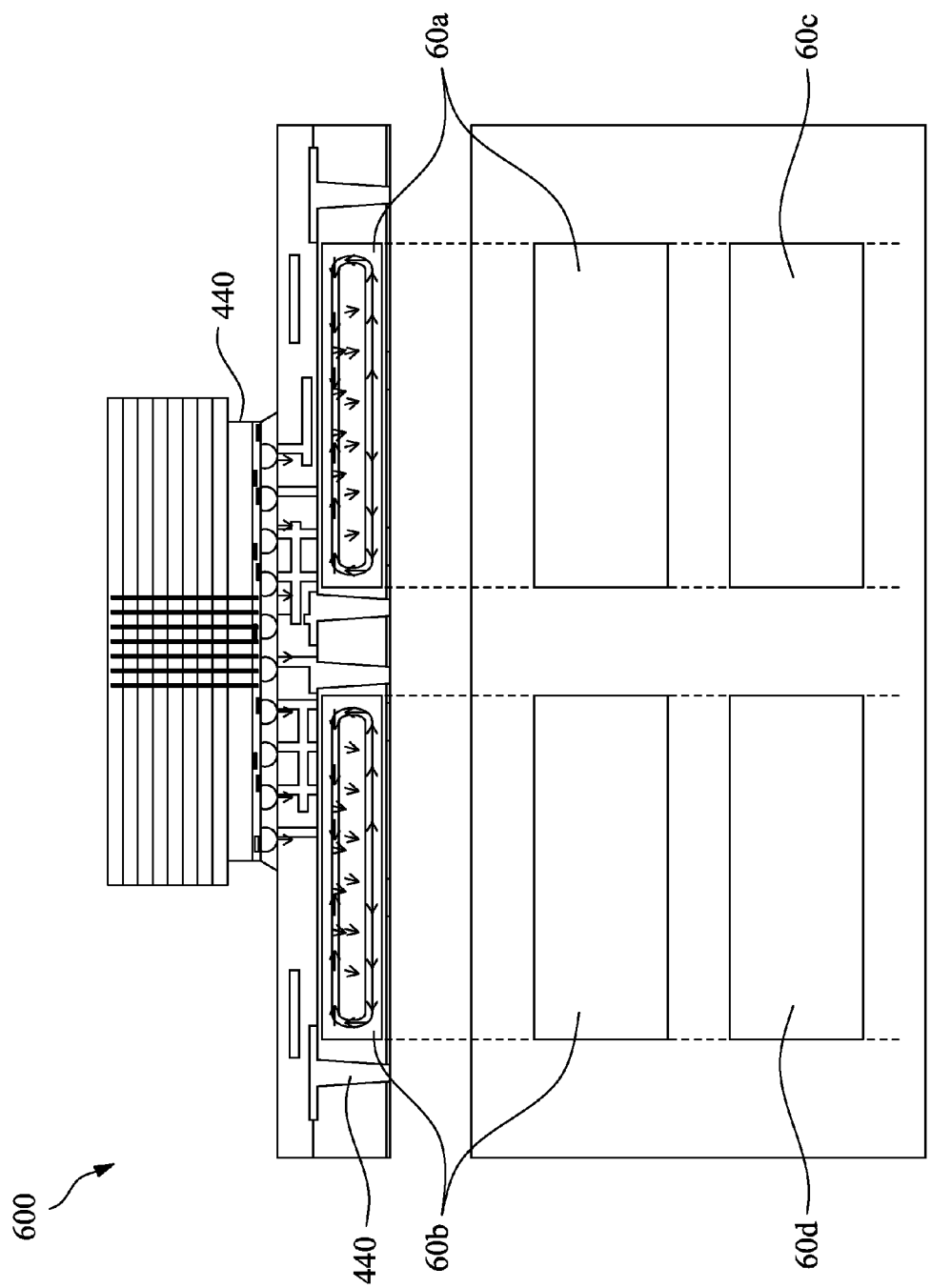
FIG. 6A is a cross-section view and a top view of a 3DIC including heat spreaders according to some embodiments.

FIG. 6A is a cross sectional view and top view of a 3DIC 600 including heat spreaders 60a-60d in accordance with some embodiments. In some embodiments, heat spreaders 60a-60d, TIM 50 and vias 430 are collectively referred to as a heat spreading structure. In some embodiments, 3DIC 600 includes external cooling unit 420 over stack of memory units 410. 3DIC 600 is similar to 3DIC 400 and same elements have the same reference numbers. In comparison with 3DIC 400 (FIG. 4), 3DIC 600 includes heat spreaders 60a-60d separated into four sections. A portion of substrate 450 extends between at least a portion of adjacent sections 60a-60d. At least one conductive via 440 extends through substrate 450 between adjacent sections 60a-60d.

A total area of heat spreaders 60a-60d is greater than the area of die 20. In some embodiments, the total area of heat spreaders 60a-60d is at least twice the area of die 20. In some embodiments, a ratio of the total area of sections 60a-60d to the area of die 20 ranges from about 2 to about 4.

In some embodiments, each of sections 60a-60d is completely separated from second section 60b. In some embodiments, at least one section 60a-60d is connected to at least one other section 60a-60d.

Similar to 3DIC 500 (FIG. 5), openings between heat spreaders 60a-60d help to reduce the complexity of the routing scheme of 3DIC 600 in comparison with 3DIC 400. In some embodiments, 3DIC 600 includes more or less than four sections. Increasing a number of openings between heat spreaders 60a-60d provides greater access to direct routing of electrically conductive paths between die 20 and substrate 470. However, increasing the number of openings between heat spreaders 60a-60d removes portions of the heat spreaders closest to die 20 which reduces an efficiency of absorbing thermal energy from the die.

Figure 6B:
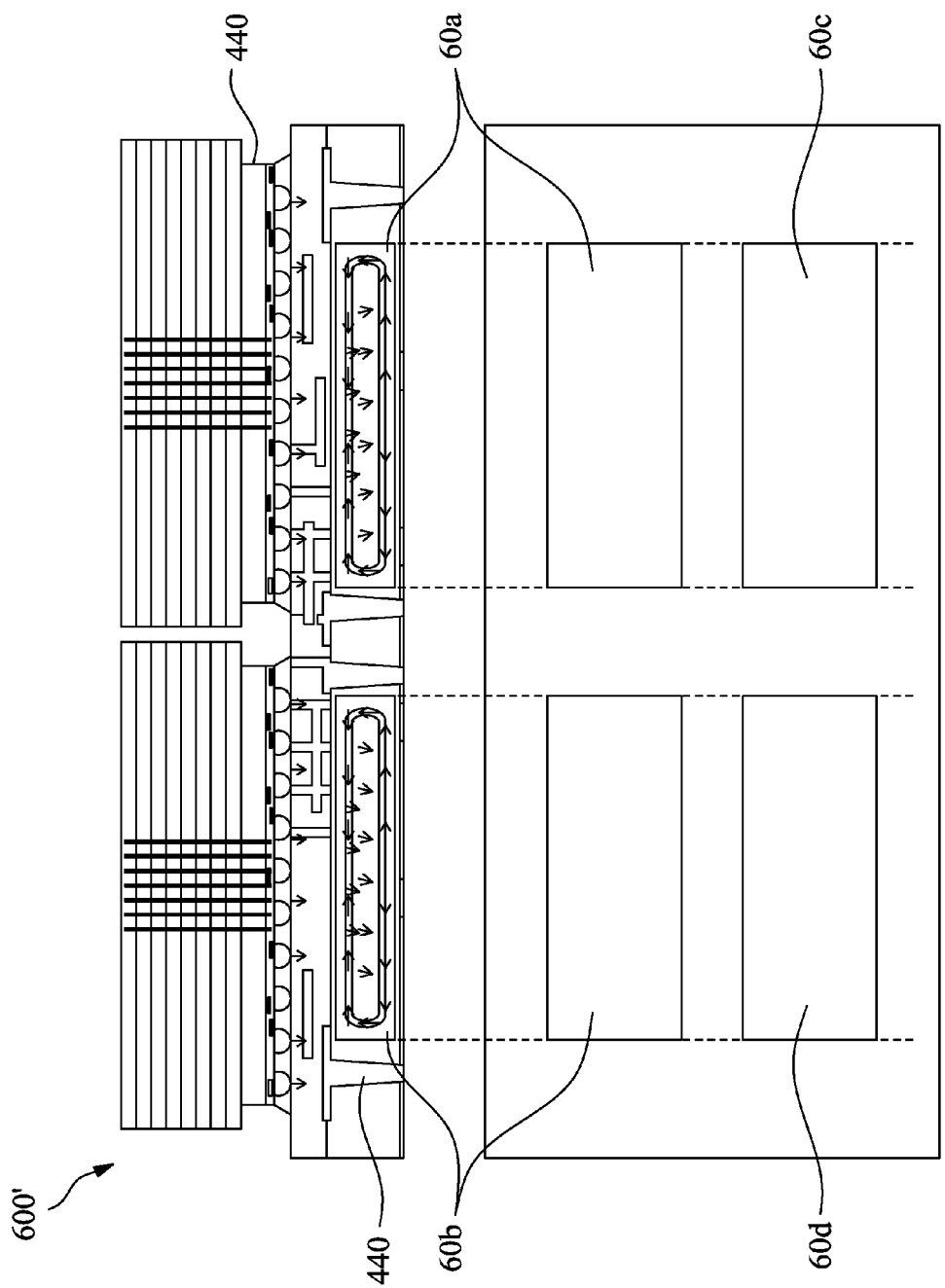
FIG. 6B is a cross-section view and a top view of a 3DIC including heat spreaders according to some embodiments.

FIG. 6B is a cross sectional view and top view of a 3DIC 600' including a heat spreaders 60a-60d in accordance with some embodiments. In comparison with 3DIC 600, 3DIC 600' includes to plural dies 20 and plural stacks of memory units 410 each of which is connected to heat spreaders 60a-60d. A total area of heat spreaders 60a-60d is greater than a total area of the plural dies 20. In some embodiments, the total area of heat spreaders 60a-60d is at least twice the total area of the plural dies 20. In some embodiments, a ratio of the total area of heat spreaders 60a-60d to the total area of the plural dies 20 ranges from about 2 to about 4. 3DIC 600' includes a one to two ratio between the number of dies 20 and the number of heat spreaders 60a-60d. In some embodiments, multiple dies 20 are connected to a same heat spreader 60a, 60b, 60c or 60d. In some embodiments, multiple heat spreaders 60a, 60b, 60c or 60d are connected to a single die 20. In some embodiments, some heat spreaders 60a-60d are connected to multiple dies 20 and other heat spreaders 60a-60d are connected to a single die 20.

Figure 7A:
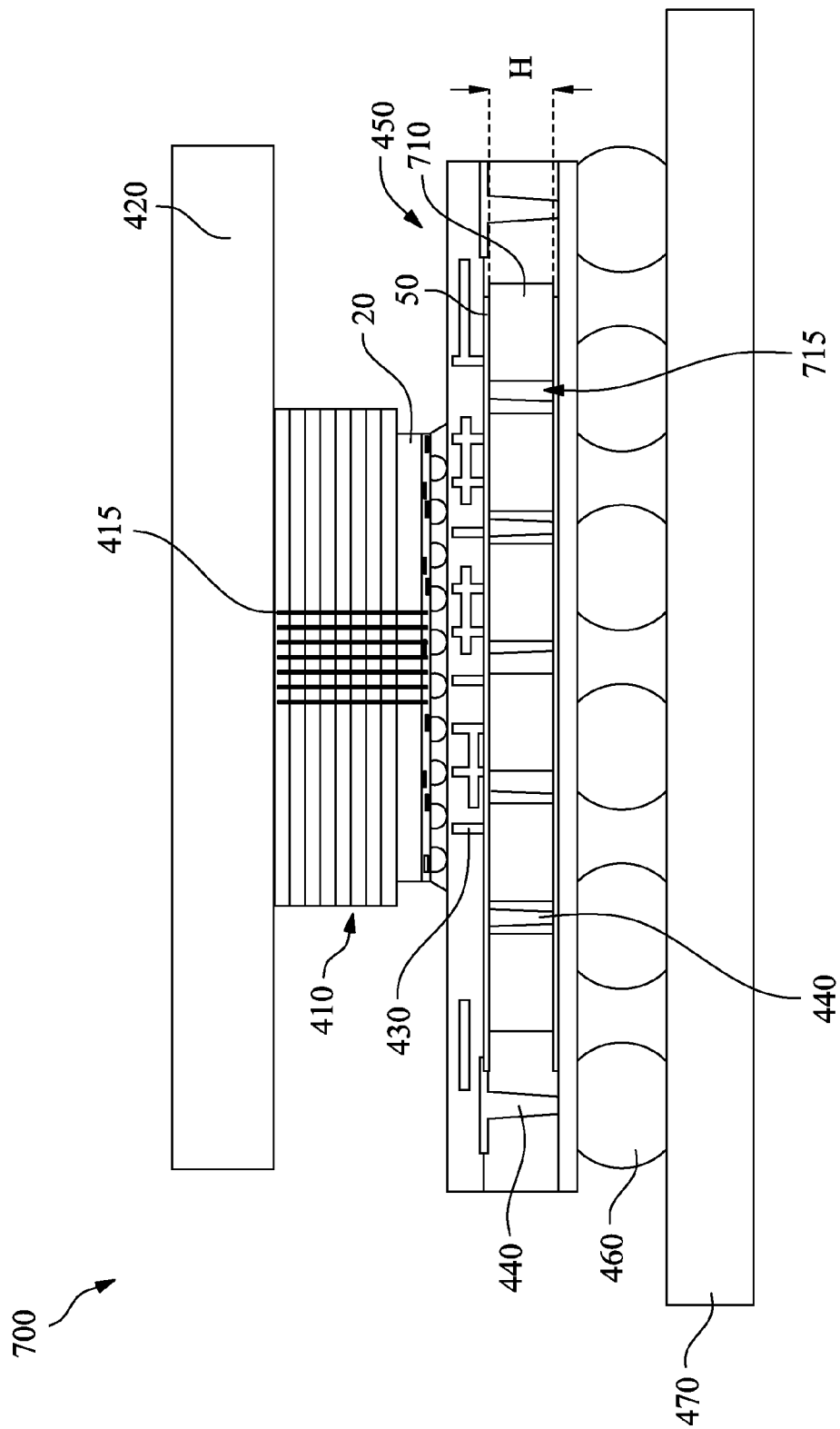
FIG. 7A is a cross-section view of a 3DIC including a heat spreader according to some embodiments.

FIG. 7A is a cross sectional view of a 3DIC 700 including a heat spreader 710. In some embodiments, heat spreader 710, TIM 50 and vias 430 are collectively referred to as a heat spreading structure. 3DIC 700 is similar to 3DIC 400 (FIG. 4). Same elements have a same reference number. In comparison with 3DIC 400, 3DIC 700 includes a graphite heat spreader 710. Heat spreader 710 surrounds a plurality of islands 715 to permit routing of conductive vias 440. Islands 715 are portions of substrate 450 that remain following patterning of substrate 450 for formation of heat spreader 710.

In comparison with other heat spreaders, e.g., heat spreader 60 (FIG. 4), heat spreaders 60a and 60b (FIG. 5) or heat spreaders 60a-60d (FIG. 6), heat spreader 710 does not include a vapor chamber and is easier to integrate into a manufacturing process because specialized structures are not separately manufactured or purchased. Use of heat spreader 710 also facilitates tailoring the heat spreader to a previously designed routing scheme while avoiding redesigning the heat spreader.

Heat spreader 710 is formed by patterning substrate 450 to form a plurality of cavities. In some embodiments, locations of the plurality of cavities is determined based on a predetermined routing scheme for 3DIC 700. In some embodiments, substrate 450 is patterned using laser drilling. In some embodiments, substrate 450 is patterned using an etching process or another suitable patterning technique. Graphite material is then formed in the plurality of cavities. The non-patterned portions of substrate 450 define locations of islands 715 in heat spreader 710. In some embodiments, the graphite material is formed by CVD, PVD, spin-on coating or another suitable formation process. In some embodiments, the graphite material in each of the plurality of cavities is thermally connected to the graphite material in every other cavity of the plurality of cavities. In some embodiments, at least one portion of the graphite material in at least one cavity of the plurality of cavities is thermally separated from at least another portion of the graphite material in a different cavity of the plurality of cavities.

In some embodiments, heat spreader 710 is formed by etching a single cavity in substrate 450. The graphite material is formed in the single cavity. The graphite material is then patterned to provide islands 715 for routing of conductive vias 440. In some embodiments, the graphite material is patterned using laser drilling, etching or another suitable patterning process. In some embodiments, a height H of heat spreader 710 ranges from about 0.2 mm to about 1.0 mm to provide sufficient heat spreading ability without needlessly increasing a size of 3DIC 70. In some embodiments, height H of heat spreader 710 ranges from about 0.8 mm to about 1.0 mm.

Figure 7B:
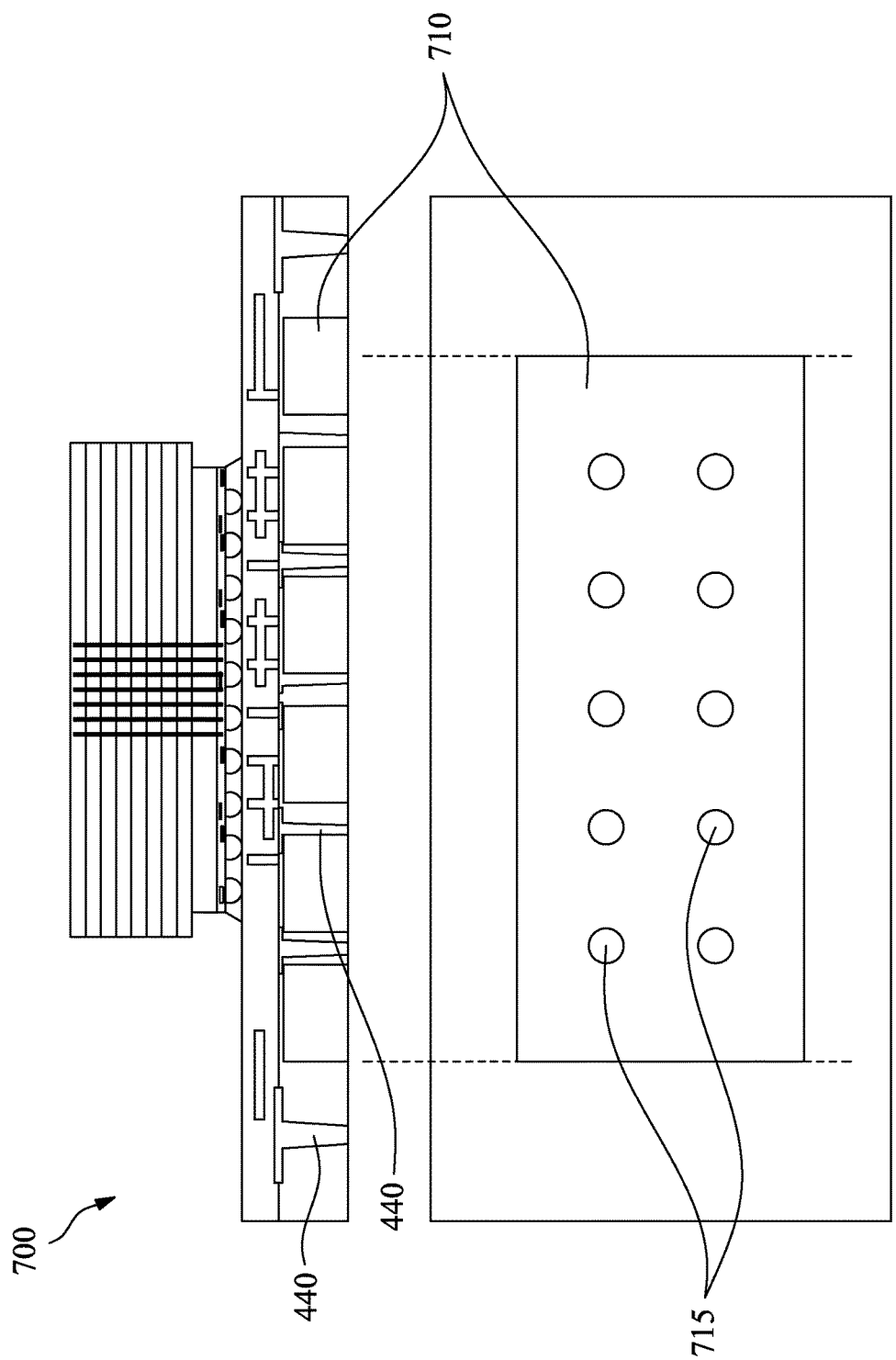
FIG. 7B is a cross-section view and a top view of a 3DIC including a heat spreader according to some embodiments.

FIG. 7B is a cross sectional view and a top view of 3DIC 700 including heat spreader 710. Islands 715 are arranged in a two-dimensional array in the top view of 3DIC 700. In some embodiments, islands 715 are randomly arranged. In some embodiments, islands 715 are arranged in a regular pattern, a quasi-regular pattern, or another suitable grouping.

Figure 7C:
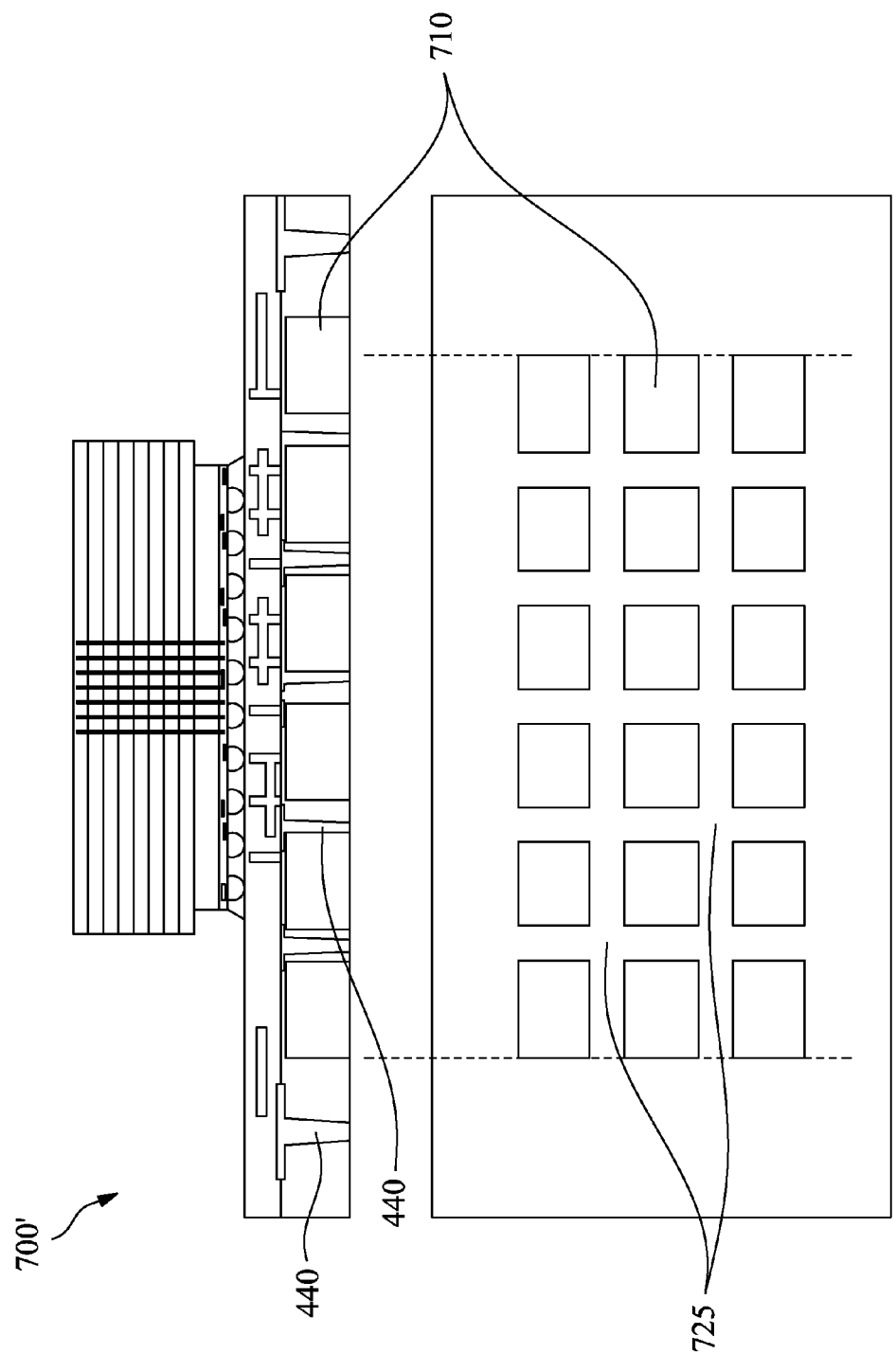
FIG. 7C is a cross-section view and a top view of a 3DIC including a heat spreader according to some embodiments.

FIG. 7C is a cross sectional view and a top view of 3DIC 700' including heat spreader 710. In comparison with 3DIC 700, 3DIC 700' includes extensions 725 laid out in a regular grid pattern. Extensions 725 are part of substrate 450 that extend between portions of heat spreader 710. Extensions 725 extend in two orthogonal directions. In comparison with islands 715, extensions 725 extend continuously across heat spreader 710. In some embodiments, extensions 725 extend discontinuously across heat spreader 710. In some embodiments, extensions 725 extend in a single direction across heat spreader 710. In some embodiments, extensions 725 are arranged in an irregular grid layout where spacing between neighboring extensions 725 is different.

FIGS. 8A-8J are cross sectional views of a 3DIC at various stages of production. Same reference numbers in FIGS. 9A-9J correspond to same elements described above. Some reference numbers in FIGS. 9A-9J are not repeated in every Figure for clarity. FIG. 8A includes substrate 450 prior to formation of openings in the substrate 450. FIG. 8B includes opening 810 in substrate 450. Opening 810 is for receiving the heat spreader. FIG. 9B also includes openings 820 in substrate 450. Openings 820 are for vias 440. In some embodiments, opening 810 and openings 820 are formed simultaneously. In some embodiments, opening 810 and openings 820 are formed sequentially. Opening 810 and openings 820 are formed in substrate 450 by a material removal process. In some embodiments, the material removal process includes etching, laser drilling or another suitable material removal process. In some embodiments, opening 810 is a plurality of openings. In some embodiments, at least a portion of substrate 450 remains between a first portion of opening 810 and a second portion of opening 810. In some embodiments, the remaining portion of substrate 450 includes intersecting extensions, e.g., extensions 725. In some embodiments, the remaining portion of substrate 450 includes islands, e.g., islands 715. In some embodiments including a plurality of openings 810, the plurality of openings 810 are connected to each other. In some embodiments including a plurality of openings 810, each opening of the plurality of openings is separated from other openings of the plurality of openings by portions of the first substrate. In some embodiments, additional openings are formed in islands or extensions of substrate 450 to provide routing between portions of a heat spreader.

FIG. 8C includes heat spreader 60 located in opening 910. In some embodiments, heat spreader 60 is replaced by heat spreader 60a-60d, or heat spreader 710. In some embodiments, the heat spreader 60 includes a vapor chamber. In some embodiments, the heat spreader comprises graphite.

FIG. 8D includes vias 440 formed in openings 920. At least one second via 440 of the vias 440 is formed around a periphery of the heat spreader 60. In some embodiments, the vias 440 are formed by filling a hole in the substrate 450 with a conductive material.

FIG. 8E includes TIM 50 formed over the top and bottom surfaces of heat spreader 60. In some embodiments, TIM 50 is formed by spin-on coating, printing, PVD or another suitable formation process.

FIG. 8F includes routing layer 480 formed over the first surface of substrate 450. The routing layers 480 provide electrical connections for propagating signals between structures connected to the substrate 450. Routing layer 480 includes at least one RDL, e.g., RDL 485 (FIG. 4A), and vias, e.g. vias 430. Each RDL is electrically connected to at least one via 440. In some embodiments, the routing layer 480 also includes vias for connecting to vias 440 formed in islands 715 or extensions 725. In some embodiments, the RDL and/or the vias of the routing layer 480 are formed by a same process as vias 440. In some embodiments, the RDL and/or the vias of the routing layer 480 are formed by a different process from vias 440.

FIG. 8G includes routing layer 480 formed on the second surface of substrate 450. In some embodiments, substrate 450 is removably connected to a temporary carrier (not shown) to facilitate formation of routing layer 480 on the second surface of the substrate 450.

FIG. 8H includes die 20 and stack of memory units 410 bonded to substrate 450 by routing layer 480 on the first surface of substrate 450. In some embodiments, die 20 and stack of memory unites 410 are bonded together prior to bonding die 20 to substrate 450. In some embodiments, die 20 is bonded to substrate 450 before stack of memory units 410 is bonded to die 20. Die 20 is connected to the RDL and/or vias in the routing layer 480 on a first surface of the first substrate. In some embodiments, the die 20 is bonded to the substrate 450 by a reflow process. In some embodiments, the RDL or vias in the routing layer 480 on the first surface thermally connect the die 20 with the heat spreader 60. In some embodiments, more than one die package, e.g., die 20 and stack of memory units 410, is bonded to the first surface of substrate 450. In some embodiments, multiple logic devices are bonded to the first surface of substrate 450.

FIG. 8I includes conductive elements 460 bonded to substrate 450 by routing layer 480 on the second surface of substrate 450. In some embodiments, conductive elements 460 are bonded to the second surface of substrate 450 by a reflow process.

FIG. 8J includes substrate 470 bonded to substrate 450 by conductive elements 460. In some embodiments, substrate 470 is bonded to the substrate 450 by a reflow process. The substrate 470 is electrically connected to the die 20 and stack of memory units 410 by second vias 440 and/or vias 430 and RDL 485 through the routing layers 480 on the first and second surfaces of the first substrate. FIGS. 8A-8J provide an example of a process for forming a 3DIC similar to 3DIC 400 (FIG. 4A). In some embodiments, the process flow is modified in order to form other 3DICs, such as 3DIC 400' (FIG. 4B), 3DIC 400" (FIG. 4C), 3DIC 500 (FIG. 5A), 3DIC 500' (FIG. 5B), 3DIC 600 (FIG. 6A), 3DIC 600'(FIG. 6B), 3DIC 700 (FIG. 7A), 3DIC 700' (FIG. 7C).

In some embodiments, an order of operations of FIGS. 8A-8J is changed. In some embodiments, operations of FIGS. 8A-8J are removed or combined together into a single operation. In some embodiments, additional operations, such as including an external cooling unit, are added to the process flow of FIGS. 8A-8J. In some embodiments, the external cooling unit 420 is added after the substrate 470 is bonded to substrate 450. In some embodiments, the external cooling unit 420 is bonded to stack of memory units 410 prior to bonding die 20 to substrate 450. In some embodiments, the external cooling unit 420 is bonded to stack of memory units 410 after bonding die 20 to substrate 450.

One aspect of this description relates to a three dimensional integrated circuit (3DIC). The 3DIC includes a first substrate and a heat spreader embedded in the first substrate. The 3DIC further includes a die electrically connected to the first substrate, wherein the die is thermally connected to the heat spreader. The 3DIC further includes a plurality of memory units on the die, wherein the die is between the plurality of memory units and the first substrate, and the plurality of memory units is thermally connected to the heat spreader by the die. The 3DIC further includes an external cooling unit on the plurality of memory units, wherein the plurality of memory units is between the die and the external cooling unit, and the die is thermally connected to the external cooling unit by the plurality of memory units.

Another aspect of this description relates to a three dimensional integrated circuit (3DIC). The 3DIC includes a first substrate. The 3DIC further includes a heat spreading structure embedded in the first substrate. The heat spreading structure includes a heat spreader, a thermal interface material (TIM) over at least first surface of the heat spreader, and a plurality of first vias in contact with the TIM. The 3DIC further includes a die electrically connected to the first substrate, wherein the plurality of first vias is connected to the die. The 3DIC further includes a plurality of conductive vias electrically connected to the die, wherein at least one conductive via of the plurality of conductive vias extends through the first substrate between a first portion of the heat spreader and a second portion of the heat spreader. The 3DIC further includes a plurality of conductive elements on the first substrate, wherein the plurality of conductive elements are on a surface of the first substrate opposite to the die, and the plurality of conductive elements are electrically connected to corresponding conductive vias of the plurality of conductive vias.

Still another aspect of this description relates to a method of forming a three dimensional integrated circuit (3DIC). The method includes patterning a substrate to define at least one cavity in the substrate. The method further includes embedding a heat spreader in the at least one cavity, wherein a portion of the substrate extends through the heat spreader. The method further includes defining a plurality of vias in the substrate, wherein the plurality of vias is thermally connected to the heat spreading structure. The method further includes defining a plurality of conductive vias in the substrate, wherein at least one conductive vias of the plurality of conductive vias extends the portion of the substrate extending through the heat spreader. The method further includes bonding a die on the substrate, wherein the die is thermally connected to the plurality of vias, and the die is electrically connected to the plurality of conductive vias.

The preceding disclosure was described with reference to exemplary embodiments. It will, however, be evident that various modifications, structures, processes, and changes may be made thereto without departing from the broader spirit and scope of the embodiments, as set forth in the claims. The specification and drawings are, accordingly, to be regarded as illustrative and not restrictive. It is understood that embodiments are capable of using various other combinations and environments and are capable of changes or modifications within the scope of the inventive concept as expressed herein.

What is claimed is:

1. A three dimensional integrated circuit (3DIC) comprising:
    a first substrate;
    a heat spreader embedded in the first substrate;
    a thermal interface material (TIM) over at least first surface of the heat spreader;
    a die electrically connected to the first substrate, wherein the die is thermally connected to the heat spreader via the TIM;
    a plurality of memory units on the die, wherein the die is between the plurality of memory units and the first substrate, and the plurality of memory units is thermally connected to the heat spreader by the die; and
    an external cooling unit on the plurality of memory units, wherein the plurality of memory units is between the die and the external cooling unit, the external cooling unit comprises a thermally conductive material, and the die is thermally connected to the external cooling unit by the plurality of memory units.

2. The 3DIC of claim 1, further comprising a plurality of vias extending into the first substrate, wherein the plurality of vias thermally connect the die to the heat spreader.

3. The 3DIC of claim 2, wherein at least one via of the plurality of vias is configured to electrically connect the first substrate to the die.

4. The 3DIC of claim 2, wherein a density of the plurality of vias is greater than 3%, wherein the density is a total area of the plurality of vias divided by a total area of the die.

5. The 3DIC of claim 2, wherein at least one via of the plurality of vias is electrically separated from the die.

6. The 3DIC of claim 1, wherein a total area of the heat spreader is at least two times greater than an area of the die.

7. The 3DIC of claim 1, wherein the heat spreader comprises graphite.

8. The 3DIC of claim 7, further comprising:
a plurality of conductive elements on the first substrate, wherein the heat spreader is between the die and the plurality of conductive elements; and
at least one conductive via electrically connecting the die to a corresponding conductive element of the plurality of conductive elements, wherein the at least one conductive via extends through an island of the first substrate extending through the heat spreader.

9. The 3DIC of claim 1, wherein the heat spreader comprises at least one vapor chamber.

10. The 3DIC of claim 9, wherein the at least one vapor chamber is a plurality of vapor chambers.

11. The 3DIC of claim 9, further comprising:
a plurality of conductive elements on the first substrate, wherein the heat spreader is between the die and the plurality of conductive elements; and
at least one conductive via electrically connecting the die to a corresponding conductive element of the plurality of conductive elements, wherein the at least one conductive via extends through the first substrate between adjacent vapor chambers of the plurality of vapor chambers.

12. The 3DIC of claim 9, wherein the at least one vapor chamber comprises a vapor chamber comprising a plurality of connected sections, wherein the plurality of connected sections define at least one opening therebetween.

13. The 3DIC of claim 9, further comprising:
a plurality of conductive elements on the first substrate, wherein the heat spreader is between the die and the plurality of conductive elements; and
at least one conductive via electrically connecting the die to a corresponding conductive element of the plurality of conductive elements, wherein the at least one conductive via extends through the at least one opening.

14. The 3DIC of claim 1, further comprising:
a plurality of conductive elements on the first substrate, wherein the heat spreader is between the die and the plurality of conductive elements; and
a plurality of conductive vias electrically connecting the die to corresponding conductive elements of the plurality of conductive elements, wherein each conductive via of the plurality of conductive vias is located around a periphery of the heat spreader.

15. The 3DIC of claim 1, further comprising a second substrate electrically connected to the die through the first substrate.

16. The 3DIC of claim 15, further comprising a second external cooling unit thermally connected to the second substrate on a surface of the second substrate opposite to the first substrate.

17. A three dimensional integrated circuit (3DIC) comprising:
a first substrate;
a heat spreading structure embedded in the first substrate, wherein the heat spreading structure comprises:
a heat spreader,
a thermal interface material (TIM) over at least first surface of the heat spreader, and
a plurality of first vias in contact with the TIM;
a die electrically connected to the first substrate, wherein the plurality of first vias is connected to the die, and the plurality of first vias is between the die and the heat spreader;
a plurality of conductive vias electrically connected to the die, wherein at least one conductive via of the plurality of conductive vias extends through the first substrate between a first portion of the heat spreader and a second portion of the heat spreader;
a plurality of conductive elements on the first substrate, wherein the plurality of conductive elements are on a surface of the first substrate farthest from the die, and the plurality of conductive elements are electrically connected to corresponding conductive vias of the plurality of conductive vias.

18. The 3DIC of claim 17, wherein a density of the plurality of first vias is greater than 3%, wherein the density is a total area of the plurality of vias divided by a total area of the die.

19. The 3DIC of claim 17, wherein a total area of the heat spreading structure is at least two times greater than an area of the die.

20. A three dimensional integrated circuit (3DIC) comprising:
a first substrate;
a heat spreader embedded in the first substrate;
a thermal interface material (TIM) over at least first surface of the heat spreader;
a first die electrically connected to the first substrate, wherein the first die is thermally connected to the heat spreader via the TIM;
a second die electrically connected to the first substrate, wherein the second die is thermally connected to the heat spreader;
a plurality of memory units on the first die, wherein the first die is between the plurality of memory units and the first substrate, and the plurality of memory units is thermally connected to the heat spreader by the first die; and
an external cooling unit on the plurality of memory units, wherein the plurality of memory units is between the first die and the external cooling unit, the external cooling unit comprises a thermally conductive material, and the first die and the second die are thermally connected to the external cooling unit.

* * * * *